United States Patent [19]

Takeuchi

[11] Patent Number: 5,227,003

[45] Date of Patent: Jul. 13, 1993

[54] LEAD FRAME RETAINING DEVICE

[75] Inventor: Takashi Takeuchi, Tokyo, Japan

[73] Assignee: Kabushiki Kaisha Shinkawa, Tokyo, Japan

[21] Appl. No.: 749,298

[22] Filed: Aug. 23, 1991

[30] Foreign Application Priority Data

Aug. 24, 1990 [JP] Japan .................. 2-221144

[51] Int. Cl.⁵ ............................................. B32B 31/00
[52] U.S. Cl. ................................. 156/499; 156/583.91
[58] Field of Search ................. 156/499, 583.1, 583.91

[56] References Cited

U.S. PATENT DOCUMENTS

| | | | |
|---|---|---|---|
| 3,682,748 | 8/1972 | Kimball | 156/583.1 X |
| 3,773,597 | 11/1973 | Captain et al. | 156/499 |
| 3,936,344 | 2/1976 | Ball et al. | 156/499 X |
| 4,652,328 | 3/1987 | Bischoff et al. | 156/499 X |
| 4,875,966 | 10/1989 | Perko | 156/583.1 X |
| 5,006,197 | 4/1991 | Newkirk et al. | 156/583.1 X |
| 5,078,820 | 1/1992 | Hamamura et al. | 156/583.3 X |
| 5,096,525 | 3/1992 | Engwall | 156/583.1 X |

FOREIGN PATENT DOCUMENTS

| | | | |
|---|---|---|---|
| 51-021744 | 7/1976 | Japan . | |
| 51-044864 | 12/1976 | Japan . | |
| 59-005976 | 2/1984 | Japan . | |
| 59-145128 | 8/1984 | Japan | 156/499 |
| 2-009557 | 3/1990 | Japan . | |
| 1171358 | 8/1985 | U.S.S.R. | 156/499 |

*Primary Examiner*—Robert Spitzer
*Attorney, Agent, or Firm*—Koda and Androlia

[57] ABSTRACT

A lead frame retaining device including: a heating block, a lead retainer having a retaining plate and being installed above the heating block, a retaining-plate support on which the lead frame retainer is mounted, a positioning device which securely positions the lead frame retainer on the retaining-plate support, a presser for pressing the lead frame retainer against the retaining-plate support so that a lead frame is retained between the retainer and the heating block, and a power source for vertically driving the heating block and retaining-plate support in the opposite directions relative to each other.

5 Claims, 2 Drawing Sheets

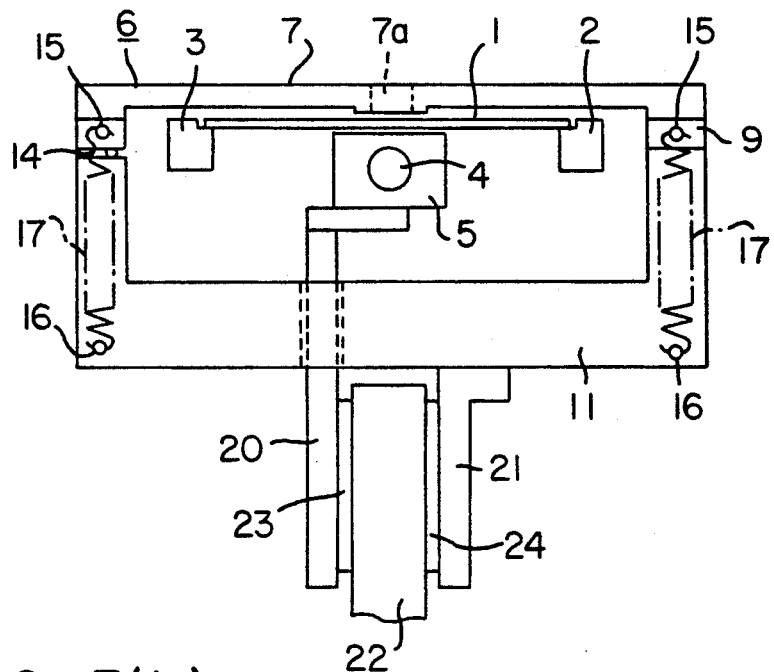
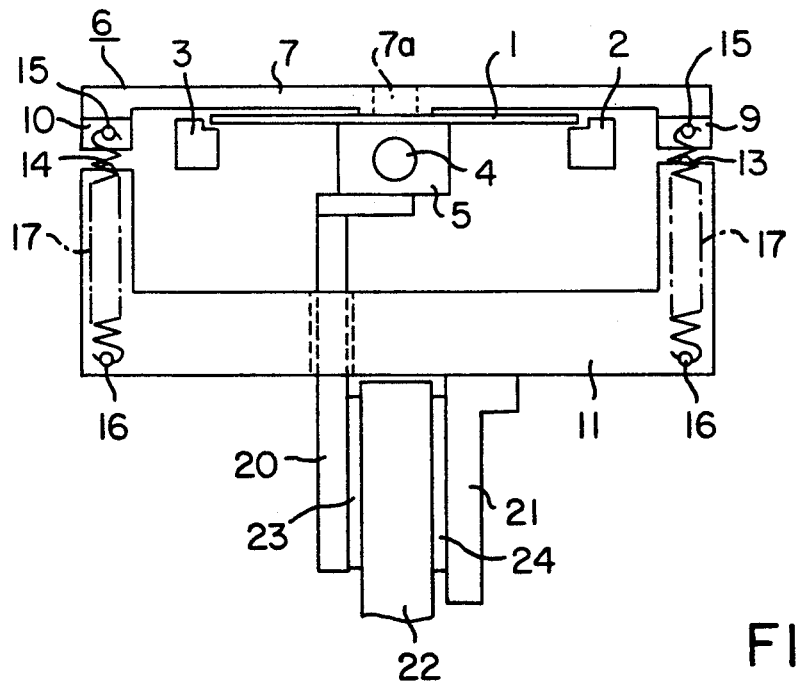
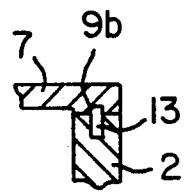

LEAD FRAME RETAINING DEVICE

BACKGROUND OF THE INVENTION

1. Field of the Invention

The present invention relates to a lead frame retaining device for use in a wire- or die-bonding apparatus.

2. Prior Art

Conventionally, two types of lead frame retaining assemblies are known.

One type has a bonding window opened in a lead frame retaining member. This type of retaining assembly is disclosed in, for example, Japanese Patent Application Publication Nos. 51-21744 and 51-44865 and also in Japanese Utility Model Application Publication No. 2-9557 (called "Conventional Example 1").

Another type of retaining assembly has also a bonding window in a lead frame retaining member and further includes a splitted lead retaining member inside the bonding window so that each lead of a lead frame is retained by slits formed by the splitted lead retaining member. This type is disclosed in, for instance, Japanese Utility Model Application Publication No. 59-5976 (called "Conventional Example 2").

In either the conventional Example 1 or 2, the lead frame retaining member and a heating block, that heats lead frames, are provided on respective blocks which are independently driven up and down.

In Conventional Example 1, the leads of lead frame are retained by a flat surface of the lead retaining section of the lead frame retaining member. As a result, it has several problems.

If the flat surface of the lead retaining section is not completely parallel to the upper surface of the heating block, portions of the lead retaining section will contact the leads in a skewed manner, and some of the leads stand up. If wire bonding is performed under this condition, faulty bonding will occur since the thermal conductivity is poor. In addition, every time the type of lead frame being handled is changed, the lead frame retaining member also needs to be changed so as to meet the new lead frame; and if the retaining member is changed, a high-precision alignment of the parts is required. This work is not easy, and it is difficult to obtain a perfect alignment between the lead retaining section and heating block.

In view of this inconvenience, Conventional Example 2 uses a system in which the lead retaining section is splitted by slits so that the retaining section corresponds to the respective leads of the lead frame. Accordingly, even if the undersurface of the lead retaining section is not completely parallel to the upper surface of the heating block, or even if there is some warping, etc. in the leads, the lead retaining section can bend elastically so that all the leads are properly retained. In this respect, Conventional Example 2 is better than Conventional Example 1.

In actuality, however, it is difficult to securely retain all the leads by the lead retaining section. More specifically, in order to retain all the leads securely, the lead retaining section must have an appropriate rigidity and elasticity. Nevertheless, the rigidity and elasticity are completely opposite properties. Thus, it is difficult to manufacture a lead frame retaining member which has both an appropriate rigidity and an appropriate elasticity. If the rigidity is increased, the elasticity suffers, causing the same problems as seen in Conventional Example 1. Conversely, if the elasticity is increased, the rigidity drops and warping of the leads and error between the heating block and the lead retaining section cannot be completely absorbed. Furthermore, a long-term use can easily cause elasticity deteriorates, etc.

SUMMARY OF THE INVENTION

Accordingly, the object of the present invention is to provide a lead frame retaining device that retains the leads of a lead frame in a reliable fashion.

The object of the present invention is accomplished by a unique structure of a lead frame retaining device that includes: a heating block; a lead frame retaining member which includes a lead retaining plate and is installed above the heating block; a retaining plate support on which the lead frame retaining member is mounted; a positioning means that positions the lead frame retaining member on the retaining-plate support; a pressing means that presses the lead frame retaining member against the retaining-plate support; and a driving means which drives the heating block and the retaining-plate support up and down relative to each other.

With the above structure, the lead frame retaining member is pressed against the retaining-plate support by the pressing means. Under this state, when the heating block is raised and the retaining-plate support is lowered with the force of the pressing means being applied to the lead frame that is between the lead frame retaining frame and the head block, the lead frame retaining member is in somewhat a floating fashion above the retaining plate support. Under this floating fashion, the lead frame is pressed against the heating block by the retaining member.

As seen from the above, since the lead frame retaining member presses the leads of the lead frame in a free or floating state by way of the force of the pressing means, the pressing section of the lead frame retaining member automatically conforms to the surface of the heating block. Thus, all the leads are securely pressed against the heating block.

BRIEF DESCRIPTION OF THE DRAWINGS

FIG. 3 shows cross-sectional views thereof wherein FIG. 3(a) shows the device with a lead frame not clamped, and FIG. 3(b) shows the device with a lead frame clamped; and FIG. 4 is a cross section taken along the line 4—4 in FIG. 1.

DESCRIPTION OF THE INVENTION

One embodiment of the present invention will be explained below with reference to the accompanying drawings.

Figure 1:
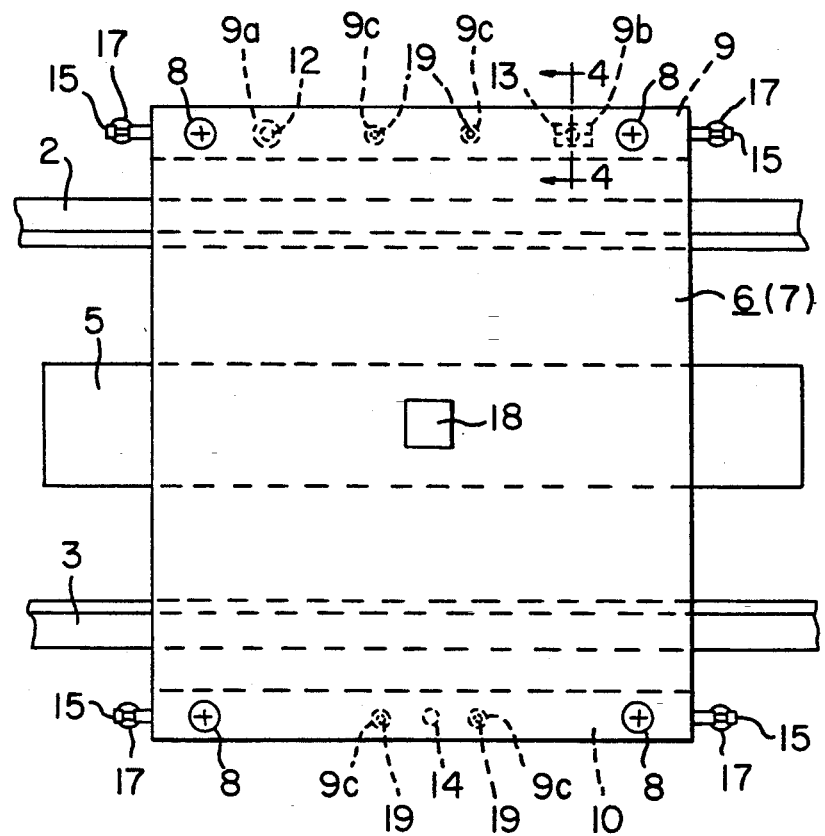
FIG. 1 is a plan view of one embodiment of the lead frame retaining device according to the present invention.
Figure 2:
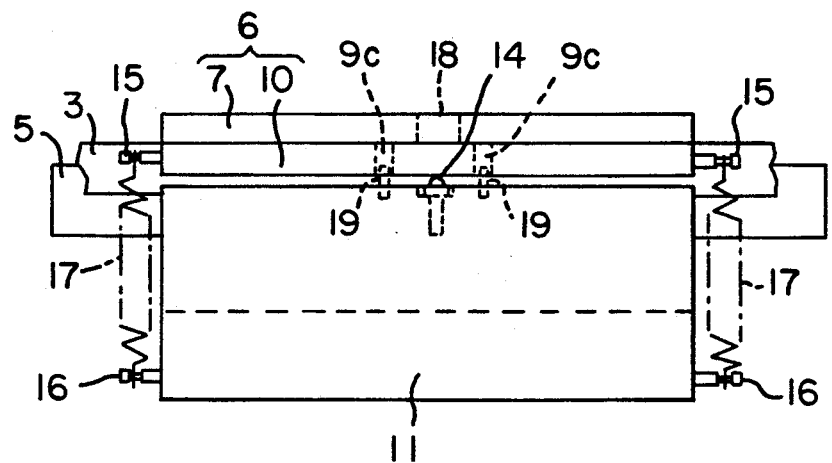
FIG. 2 is a front view thereof.

In FIG. 1, guide rails 2 and 3 which guide lead frame 1 are installed so as to face each other, and a heating block 5 which contains a heater 4, as shown in FIGS. 3(a) and 3(b), is provided between the guide rails 2 and 3.

A lead frame retaining member 6 is positioned above the heating block 5. The lead frame retaining member 6 is made up with a lead frame retaining plate 7 that has a bonding window 7a, and blocks 9 and 10 which are secured by screws 8 to the undersurfaces of the lead frame retaining plate 7. The blocks 9 and 10 locate outside the guide rails 2 and 3 and are mounted on the upper surfaces of a retaining-plate support 11 which is, as seen from FIG. 3(a), U-shaped in cross section.

A standard hole 9a which is countersunk in a conical shape and a V-shaped rotation-restraining groove 9b which extends in the direction parallel to the guide rails 2 and 3, are formed in the block 9. A standard pin 12 which is to be inserted into the standard hole 9a, a rotation-restraining pin 13 which is inserted into the rotation-checking groove 9b, and a receiving pin 14 which receives the undersurface of the block 10, are formed on the retaining-plate support 11.

The standard hole 9a, the rotation-restraining groove 9b, the standard pin 12, the rotation-restraining pin 13 are provided for the purpose of accomplishing a secure positioning of the lead frame retaining member 6 at a predetermined position on the retaining-plate support 11.

First spring hooks 15 are attached to the left and right ends of each of the blocks 9 and 10. Second spring hooks 16 are attached to the lower portions of the end surfaces of the retaining-plate support 11 at positions corresponding to the first spring hooks 15. Springs 17 are mounted between the corresponding spring hooks 15 and 16 so that the blocks 9 and 10 along with the lead frame retaining plate 7 are urged in a direction that the blocks 9 and 10 are pressed against the retaining-plate support 11. The four springs 17 are installed in symmetrical positions which are equidistant from the bonding center 18.

The heating block 5 and retaining-plate support 11 are respectively mounted on vertically moving blocks 20 and 21. The moving blocks 20 and 21 are fitted on a fixed part 22 of the apparatus through linear guides 23 and 24, respectively, so that they are independently driven upward and downward by a driving means (not shown).

In operation, with the lead frame retaining member 6 raised and the heating block 5 being in a lowered position as shown in FIG. 3(a), a lead frame 1 is fed in by a feeding mechanism (not shown). The bonding area of the lead frame 1 is positioned below the bonding window 7a of the lead frame retaining plate 7.

Next, as shown in FIG. 3(b), the vertically moving block 20 is raised, and the heating block 5 comes into contact with the lead frame 1. Then, the vertically moving block 21 is lowered so that the lead frame retaining plate 7 of the lead frame retaining member 6 contacts the lead frame 1. When the vertically moving block 21 is lowered even further from this point, the lead frame retaining plate 7 cannot be lowered any further, since it is in contact with the lead frame 1. As a result, a gap is created between the blocks 9 and 10 and the retaining-plate support 11, and the lead frame retaining plate 7 presses the lead frame 1 against the heating block 5 by the force of the springs 17.

Thus, the lead frame retaining member 6 presses against the leads of the lead frame 1 in a free state by the springs 17. Thus, a pressing area of the lead frame retaining plate 7 can automatically conform to the surface of the heating block 5, so that all the leads of the lead frame 1 are securely pressed against the heating block 5. In this state, wire bonding or die bonding is performed.

After this, the vertically moving block 20 along with the heating block 5 is lowered, and the vertically moving block 21 is raised. When the heating block 5 is lowered and the vertically moving block 21 is raised, the receiving pin 14 comes into contact with the block 10, and the standard pin 12 and rotation-restraining pin 13 enter into the standard hole 9a and rotation restraining groove 9b, respectively. In other words, the lead frame retaining member 6 is positioned at a predetermined position with respect to the retaining-plate support 11 by the engagement of the standard hole 9a and standard pin 12 and the engagement of the rotation-checking groove 9b and rotation-checking pin 13.

If the vertically moving block 21 is raised even further, the lead frame retaining member 6 is raised along with the vertically moving block 21 as shown in FIG. 3(a). Then, the lead frame 1 is fed by one pitch so that the next bonding area is positioned under the bonding window 7a of the lead frame retaining plate 7.

In the embodiment described above, the lead frame retaining member 6 consists of a lead frame retaining plate 7 and blocks 9 and 10. It is possible, however, to form the lead frame retaining member 6 in a single integral unit.

If the lead frame retaining member 6 is constructed from the lead frame retaining plate 7 and locks 9 and 10, and one end of each of the springs 17 is mounted to one of the blocks 9 and 10 as in the embodiment described above, the advantages described below are obtained:

In cases where the different type of lead frame is processed, the lead frame retaining plate 7 also needs to be changed with a new one that is suited to the new lead frame. If the lead frame retaining member 6 is formed as a single unit, it is necessary to detach and reattach the springs 17 when the lead frame retaining member 6 is changed. This operation is extremely troublesome. On the other hand, if the lead frame retaining member 6 is made from the lead frame retaining plate 7 and two blocks 9 and 10, as described in the embodiment, the change of the retaining member is made by merely removing and remounting the screws 8, which is very easy and takes only a short period of time.

In the embodiment of the present invention described above, a positioning of the lead frame retaining member 6 on the retaining-plate support 11 is accomplished by means of the standard hole 9a and standard pin 12, and the rotation-checking groove 9b and rotation-checking pin 13. However, this causes some problems to happen when the lead frame retaining plate 7 is fastened to the blocks 9 and 10. That is, in the embodiment, the blocks 9 and 10 are simply pressed against the retaining-plate support 11 by the springs 17. As a result, the positions of the blocks 9 and 10 are unstable when the lead frame retaining plate 7 is fastened to the blocks 9 and 10 by the screws 8. Accordingly, in the embodiment of the present invention, two pilot holes 9c are formed in each of the blocks 9 and 10, and corresponding pilot pins 19 which are inserted into the pilot holes 9c are installed on the retaining-plate support 11. Thus, when the pilot pins 19 are inserted into the pilot holes 9c, the blocks 9 and 10 are stable on the retaining-plate support 11. As a result, the lead frame retaining plate 7 can easily be mounted to the blocks 9 and 10.

In addition, in the embodiment, the standard hole 9a and standard pin 12, and also the rotation-checking groove 9b and rotation-checking pin 13 are employed as a positioning means for positioning the lead frame retaining member 6 on the retaining plate support 11. However, it is also possible to use the pilot holes 9c and pilot pins 19 as the positioning means, omitting the standard hole 9a, the standard pin 12, the rotation-checking groove 9b and the rotation-checking pin 13.

Furthermore, in the embodiment, both the heating block 5 and the retaining-plate support 11 are moved vertically. However, the present invention is applicable also to an apparatus in which the heating block 5 is positionally fixed and the retaining-plate support 11 is alone moved vertically, or to an apparatus in which the retaining-plate support 11 is fixed positionally and the heating block 5 alone is moved vertically.

According to the present invention, as is clear from the above description, the lead frame retaining member presses the leads of a lead frame against the heating block in a free state through the force of the pressing means. Accordingly, a part of the lead frame retaining member that presses the leads can automatically conform to the surface of the heating block. As a result, all the leads can be securely pressed against the heating block.

Furthermore, since the lead frame retaining member is constructed from a lead frame retaining plate and two blocks, it is only necessary to change the lead frame retaining plate when the type of lead frame is changed. Accordingly, the change-over work can easily be accomplished in a short period of time.

Moreover, since springs are used and installed in symmetrical positions that are equidistant from the bonding center, the lead frame retaining member conforms even more automatically to the surface of the heating block.

I claim:

1. A lead frame retaining device comprising:
   a heating block;
   a lead frame retaining member which is installed above said heating block;
   a retaining-plate support on which the lead frame retaining member is mounted;
   positioning means for positioning said lead frame retaining member on said retaining-plate support;
   a pressing means for pressing said lead frame retaining member against said retaining-plate support, said pressing means comprising four springs which are provided in symmetrical positions that are equal distant from a bonding center, and
   a driving means for vertically driving said heating block and retaining-plate support in the opposite directions relative to each other.

2. A lead frame retaining device according to claim 1, wherein said lead frame retaining member comprising a lead frame retaining plate and blocks which are detachably attached to undersurfaces of said lead frame retaining plate.

3. A lead frame retaining device according to claim 2, wherein one end of each of said four springs is hooked to said blocks.

4. A lead frame retaining device according to claim 1, wherein said positioning means comprises a combination of a conical standard hole and V-shaped rotation-restraining groove, which are provided in the lead frame retaining member, and a standard pin and rotation-restraining pin, which are provided in the retaining-plate support, said standard pin being inserted into said standard hole and said rotation-restraining pin being inserted into said rotation-restraining groove.

5. A lead frame retaining device comprising:
   a heating block;
   a lead frame retainer having a retaining-plate, said lead frame retainer being provided above said heating block so that a lead frame is retained between said heating block and said retaining-plate;
   a retaining-plate support on which the lead frame retaining member is mounted;
   a positioning means for positioning said lead frame retainer on said retainer-plate support, said positing means being a combination of projections and recesses which fit each other;
   a pressing means for pressing said lead frame retainer against said retaining-plate support, said pressing means comprising four springs which are provided in symmetrical positions that are equal distant from a bonding center, and
   a driving means for driving said heating block and retaining-plate up and down in the opposite directions relative to each other.

* * * * *